US008385984B2

(12) United States Patent
Lee et al.

(10) Patent No.: US 8,385,984 B2
(45) Date of Patent: Feb. 26, 2013

(54) METHOD AND APPARATUS TO SUPPLY POWER VOLTAGE TO A MOBILE DEVICE IN A VARIABLE MANNER

(75) Inventors: Jae-cheol Lee, Suwon-si (KR); Hae-kwang Park, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/473,087

(22) Filed: May 16, 2012

(65) Prior Publication Data

US 2012/0257770 A1   Oct. 11, 2012

Related U.S. Application Data

(62) Division of application No. 11/651,016, filed on Jan. 9, 2007.

(30) Foreign Application Priority Data

Jun. 30, 2006   (KR) ................................ 2006-60685

(51) Int. Cl.
  *H04M 1/00* (2006.01)
  *H04M 1/04* (2006.01)
  *H01Q 1/12* (2006.01)
  *H04B 1/16* (2006.01)
(52) U.S. Cl. ..................... 455/572; 455/573; 455/550.1; 455/127.1; 455/117; 455/343.1
(58) Field of Classification Search .................. 455/572, 455/573, 550.1, 127.1, 117, 343.1
  See application file for complete search history.

(56) References Cited

U.S. PATENT DOCUMENTS

| 5,095,541 | A  | * | 3/1992 | Aisaka et al. ................. 455/571 |
| 6,006,337 | A  |   | 12/1999 | Koo |
| 6,028,945 | A  | * | 2/2000 | Gayle ........................... 381/120 |
| 6,029,074 | A  | * | 2/2000 | Irvin ............................. 455/571 |
| 6,741,127 | B2 |   | 5/2004 | Sasho et al. |
| 7,010,703 | B1 | * | 3/2006 | Kobayashi .................... 713/300 |
| 7,130,346 | B2 | * | 10/2006 | Midya et al. ................. 375/238 |
| 7,317,758 | B2 | * | 1/2008 | Alrutz et al. ................. 375/238 |
| 7,400,865 | B2 | * | 7/2008 | Jarvinen .................... 455/114.2 |
| 7,633,270 | B2 | * | 12/2009 | Wong et al. .................. 320/162 |
| 7,812,564 | B2 | * | 10/2010 | Takada ......................... 318/811 |
| 2003/0042868 | A1 | * | 3/2003 | Muramatsu ................... 320/107 |

(Continued)

FOREIGN PATENT DOCUMENTS

| CN | 86107133 | 6/1987 |
| CN | 1625076 | 6/2005 |

(Continued)

OTHER PUBLICATIONS

Chinese Office Action issued May 8, 2009 in CN Application No. 2007100058958.

(Continued)

*Primary Examiner* — Bobbak Safaipour
(74) *Attorney, Agent, or Firm* — Stanzione & Kim, LLP

(57) ABSTRACT

A method and apparatus to supply a power voltage to a mobile device in a variable manner in order to provide high output power and a high quality sound environment and a mobile device using the same. The apparatus includes a volume control unit to detect installation of an external power supply and to generate a voltage control value corresponding to a current volume level, and a DC-DC converter unit to convert a voltage of an internal power supply in a variable manner on the basis of the voltage control value generated in the volume control unit in order to drive the switching power amplifier.

6 Claims, 4 Drawing Sheets

U.S. PATENT DOCUMENTS

| | | | |
|---|---|---|---|
| 2005/0264270 A1* | 12/2005 | Saeki et al. | 323/273 |
| 2006/0006850 A1* | 1/2006 | Inoue et al. | 323/265 |
| 2008/0003959 A1* | 1/2008 | Lee et al. | 455/127.1 |
| 2009/0129017 A1* | 5/2009 | Takada | 361/695 |

FOREIGN PATENT DOCUMENTS

| | | |
|---|---|---|
| JP | 11112255 | 4/1999 |
| JP | 2000232381 | 8/2000 |
| JP | 2003-79061 | 3/2003 |
| JP | 2005192067 | 7/2005 |
| KR | 1998-035389 | 8/1998 |
| KR | 20020081069 | 10/2002 |

OTHER PUBLICATIONS

KR Notice of Allowance dated Aug. 30, 2007 of the KR Patent Application No. 10-2006-0060685.

* cited by examiner

METHOD AND APPARATUS TO SUPPLY POWER VOLTAGE TO A MOBILE DEVICE IN A VARIABLE MANNER

CROSS-REFERENCE TO RELATED APPLICATIONS

This application is a divisional application of U.S. patent application Ser. No. 11/651,016 filed Jan. 9, 2007 in the U.S. Patent and Trademark Office, which claims the benefit of Korean Patent Application No. 10-2006-0060685, filed on Jun. 30, 2006, in the Korean Intellectual Property Office, the disclosure of which is incorporated herein in its entirety by reference.

BACKGROUND OF THE INVENTION

1. Field of the Invention

The present general inventive concept relates to a mobile device, and more particularly, to an apparatus and method of supplying separate power voltage to a switching power amplifier stage in a variable manner in order to provide high output power and a high quality sound environment, and a mobile device using the same.

2. Description of the Related Art

Typically, mobile devices are internally provided with a D-class switching power amplifier and a loud speaker to play back audio signals. In the D-class amplifier, the audio signal changes into a pulse width modulation (PWM) signal in order to perform a switching operation. Also, the mobile devices adopt an external power supply unit such as a cradle and a secondary battery which is rechargeable.

A technology relating to a mobile device that uses a conventional external power supply unit illustrated in FIG. 1 is disclosed in Japanese Patent Document No. 2004-112377, entitled "Portable Information Terminal", filed in Sep. 19, 1992.

Referring to FIG. 1, the portable information terminal uses a power voltage supplied from an internal battery B to drive a D-class amplifier 18 when a power voltage is supplied from an external power supply 36. The D-class amplifier 18 is driven by a low voltage from the battery B.

In contrast, the portable information terminal cuts off the battery voltage being supplied to the D-class amplifier 180 and supplies a high external voltage to the D-class amplifier 18 when the power voltage is not supplied from the external power supply 36. Accordingly, the D-class amplifier 18 is driven by a high voltage from an external power supply 360 (not illustrated).

Generally, the external power voltage for charging the battery B has a level relatively higher than the voltage of the battery B in consideration of safety. Therefore, the conventional portable information terminal may output an abrupt loud sound when the higher level voltage is supplied, and a user's hearing may be damaged accordingly. In addition, the power supply unit of the portable information terminal of FIG. 1 is susceptible to noises and cannot guarantee safety. Furthermore, although the conventional portable information terminal is provided with an internal loud speaker, the internal loud speaker cannot be driven by a high output power due to its structural characteristic.

SUMMARY OF THE INVENTION

The present general inventive concept provides an apparatus to supply a power voltage to a mobile device in a variable manner, in which a separate power voltage to drive a switching power amplifier is supplied in a variable manner, and a volume can be adaptively controlled by a boosted voltage when an external power supply is installed, so that a signal to noise (S/N) ratio can be improved.

The present general inventive concept also provides a method of supplying a power voltage to a mobile device in a variable manner.

The present general inventive concept also provides a mobile device using the method and apparatus to supply a power voltage in a variable manner.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an apparatus to supply a power voltage to a mobile device that has a switching power amplifier in a variable manner, the apparatus including a volume control unit to detect an installation of an external power supply and to generate a voltage control value that corresponds to a current volume value, and a DC-DC converter unit to convert a voltage of an internal power supply into a DC-DC voltage in a variable manner on the basis of the voltage control value which is generated in the volume control unit to control an output level of the switching power amplifier.

The foregoing and/or other aspects and utilities of the present general inventive concept may also be achieved by providing a method of supplying a power voltage to a mobile device in a variable manner, wherein the method includes modulating a digital audio signal into a pulse width modulation (PWM) signal, detecting an installation of an external power supply, reading a volume value when it is detected that the external power supply is connected, generating a voltage control value that corresponds to the volume value by comparing the volume value with a reference value, performing a DC-DC conversion in a variable manner for a voltage supplied from an internal power supply unit on the basis of the generated voltage control value, and performing power switching on the PWM signal on the basis of the voltage control value to control a signal output.

The foregoing and/or other aspects and utilities of the present general inventive concept may also be achieved by providing a mobile device including a microcomputer unit to generate a volume value that corresponds to a volume setting, a pulse with modulation (PWM) unit to modulate a digital audio signal into a PWM signal that has a small output level, a variable power supply unit to detect an installation of an external power supply and to convert a voltage of an internal power supply into a DC-DC voltage in a variable manner on the basis of a voltage control value that corresponds to the volume value generated in the microcomputer unit, and a power switching circuit unit to perform switching power amplification on a PWM signal which is generated in the pulse width modulation unit based on a voltage output from the variable power supply unit.

The foregoing and/or other aspects and utilities of the present general inventive concept may also be achieved by providing an apparatus to supply a power voltage to a mobile device in a variable manner, the apparatus including a microcomputer to read a volume level, an internal power supply unit to generate and output an internal power voltage, and a DC-DC converter unit to receive and amplify the internal power voltage to a voltage corresponding to the volume level as the volume level increases above a predetermined threshold.

The foregoing and/or other aspects and utilities of the present general inventive concept may also be achieved by providing an apparatus to supply a power voltage to a mobile device in a variable manner, the apparatus including a volume control unit to generate a control voltage value corresponding to a volume value when an external power supply is detected and the volume value is greater than a predetermined threshold, and a DC-DC converter unit to amplify an internal power voltage to a voltage corresponding to the voltage control value to control an output level of the switching power amplifier.

The foregoing and/or other aspects and utilities of the present general inventive concept may also be achieved by providing an apparatus to supply a power voltage to a mobile device in a variable manner, the apparatus including a pulse width modulator to modulate a digital audio signal into a pulse width modulation (PWM) signal, a sensor to detect whether an external power supply is installed, a microcomputer to read a volume value when the external power supply is detected, a volume control unit to generate a voltage control value corresponding to the read volume value by comparing the read volume value with a reference value, a DC-DC converter unit to perform a DC-DC conversion in a variable manner for a voltage supplied from an internal power supply unit on the basis of the generated voltage control value, and a power switching unit to perform power switching on the PWM signal on the basis of the generated voltage control value to control a signal output.

The foregoing and/or other aspects and utilities of the present general inventive concept may also be achieved by providing an apparatus to supply a power voltage to a mobile device in a variable manner, the apparatus including a sensor to detect whether or not an external power supply is installed, a digital volume controller to control a volume of the mobile device when the external device is not installed, and a variable power supply unit to generate a voltage control value corresponding to a volume value by comparing the volume value with a reference value, and to perform a DC-DC conversion in a variable manner for a voltage supplied from an internal power supply unit on the basis of the generated voltage control value when the external device is installed.

The foregoing and/or other aspects and utilities of the present general inventive concept may also be achieved by providing a method of supplying a power voltage to a mobile device in a variable manner, wherein the method includes reading a volume level, generating an internal power voltage, and amplifying the internal power voltage to a voltage corresponding to the volume level as the volume level increases above a predetermined threshold.

The foregoing and/or other aspects and utilities of the present general inventive concept may also be achieved by providing a method of supplying a power voltage to a mobile device in a variable manner, wherein the method includes generating a control voltage value corresponding to a volume value when an external power supply is detected and the volume value is greater than a predetermined threshold, and amplifying an internal power voltage to a voltage corresponding to the voltage control value to control an output level of the switching power amplifier.

The foregoing and/or other aspects and utilities of the present general inventive concept may also be achieved by providing a method of supplying a power voltage to a mobile device in a variable manner, wherein the method includes supplying a voltage from a power supply, reading a volume value, comparing the read volume value to a reference value, controlling a volume of the mobile device using an existing digital volume control and setting the voltage of the power supply to a minimum value if the volume value is smaller than the reference value, supplying a voltage control value corresponding to the volume value to a DC-DC converter unit if the volume value is higher than the reference value, and outputting a voltage corresponding to the voltage control value to an amplifier.

The foregoing and/or other aspects and utilities of the present general inventive concept may also be achieved by providing a method of supplying a power voltage to a mobile device in a variable manner, wherein the method includes detecting whether an external power supply is installed, controlling a volume of the mobile device when the external device is not installed, and generating a voltage control value corresponding to a volume value by comparing the volume value with a reference value, and to perform a DC-DC conversion in a variable manner for a voltage supplied from an internal power supply unit on the basis of the generated voltage control value when the external device is installed.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
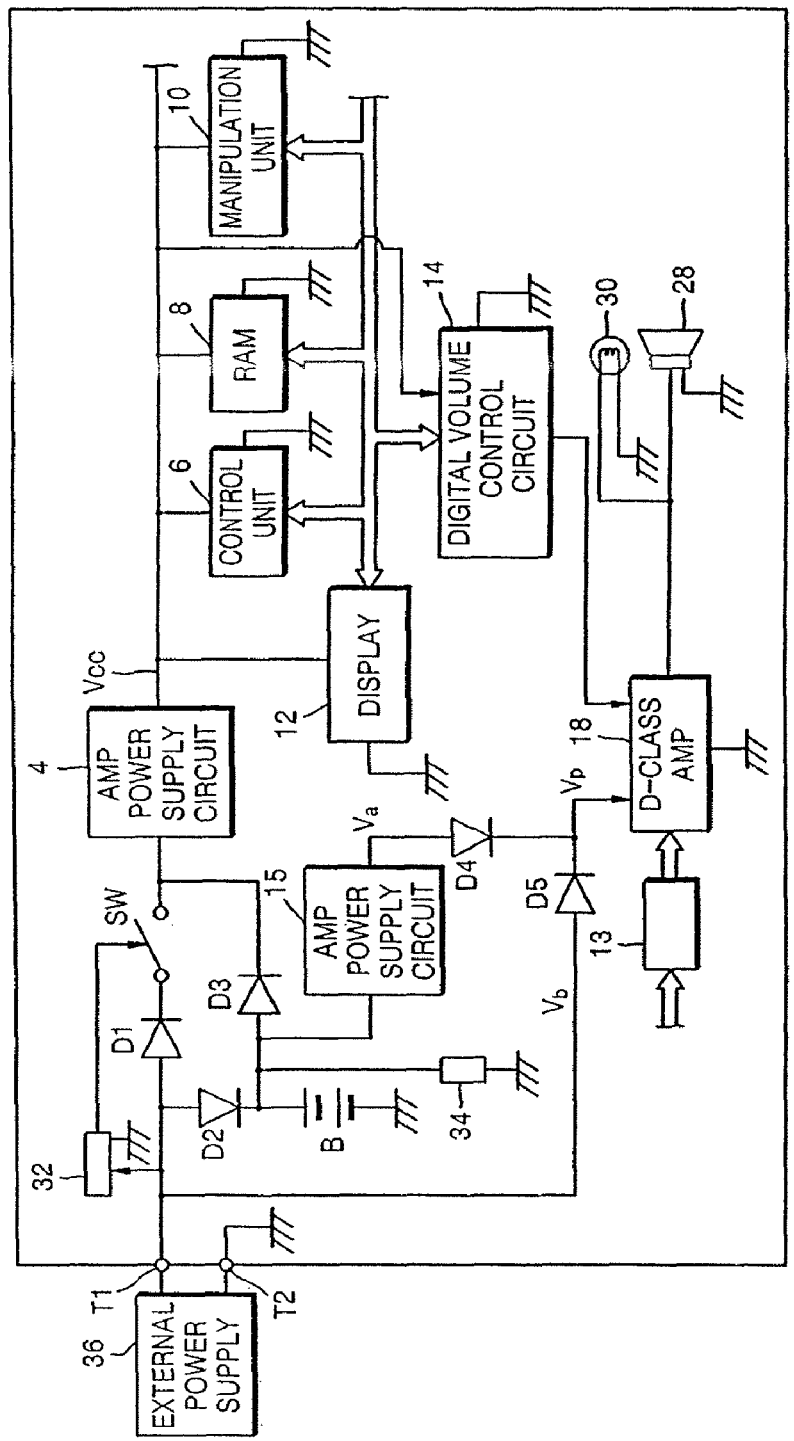
FIG. 1 is a block diagram illustrating a mobile device that has a conventional external power supply.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
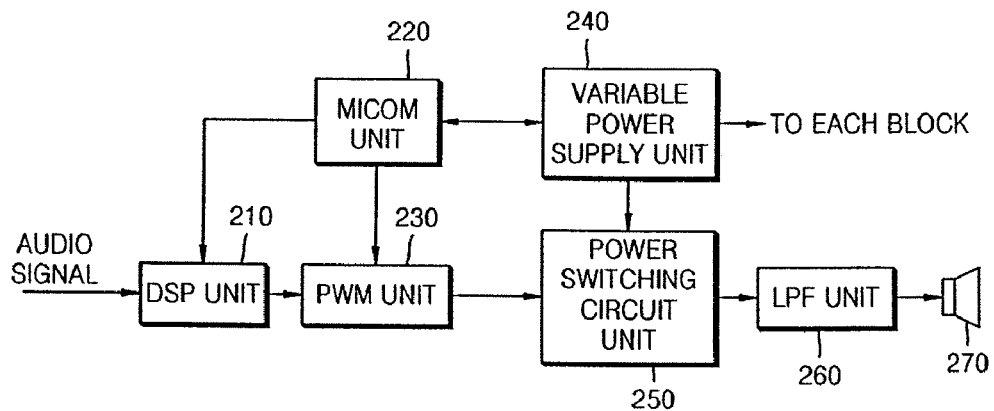
FIG. 2 is a block diagram illustrating a mobile device that is driven by a variable power supply unit according to an embodiment of the present general inventive concept.

FIG. 2 is a block diagram illustrating a mobile device driven by a variable power supply according to an embodiment of the present general inventive concept.

The mobile device of FIG. 2 includes a digital signal processing (DSP) unit 210, a microcomputer (MICOM) unit 220, a pulse width modulation (PWM) unit 230, a power switching circuit unit 250, a variable power supply unit 240, a low pass filter (LPF) unit 260, and a loud speaker unit 270.

When a volume value is input from a remote control or the like, the MICOM unit 220 converts the volume value into volume level information and a volume control signal. In this case, the MICOM unit 220 outputs the volume control signal to the DSP unit 210 according to the volume value, and also outputs the volume value to the variable power supply unit 240.

The DSP unit 210 transforms the audio signal input thereto, according to an operation control signal of the MICOM unit 220, into pulse code modulation (PCM) audio data and performs signal processing operations, such as equalization and enhancement. Particularly, the DSP unit 210 controls a gain of an input digital audio signal according to the volume control signal generated in the MICOM unit 220 when an external power supply, such as a battery charger, is not provided.

The PWM unit 230 compares levels of a carrier signal and a PCM signal output from the DSP unit 210 so as to generate a pulse width modulation (PWM) signal that has a low voltage level.

The variable power supply unit 240 generates an internal power voltage from a secondary battery to supply the power voltage to each circuit block when an external power supply, such as a battery charger, is removed. Also, the variable power supply unit 240 generates a voltage control value corresponding to the volume value input from the MICOM unit 220 when an installation of the external power supply is detected, and supplies a variable target voltage to the power switching circuit unit 250 according to the voltage control value using a DC-DC converter, which is separately provided.

The power switching circuit unit 250 amplifies a small output PWM signal, which is generated in the PWM unit 230, into a large output PWM signal according to a variable voltage supplied from the variable power supply unit 240. For example, the power switching circuit unit 250 amplifies a small output PWM signal that has a voltage level of 3.3 V into a large output PWM signal that has a voltage level of 5 to 40 V. Particularly, the power switching circuit unit 250 may amplify the output from the PWM unit 230 using a voltage supplied from a DC-DC converter separately provided in the variable power supply unit 240.

The LPF unit 260 removes noises from the PWM signal, the power of which has been amplified by the power switching circuit unit 250, by low pass filtering so as to extract an original audio signal.

The loud speaker unit 270 reproduces the audio signal extracted in the LPF unit 260.

Figure 3:
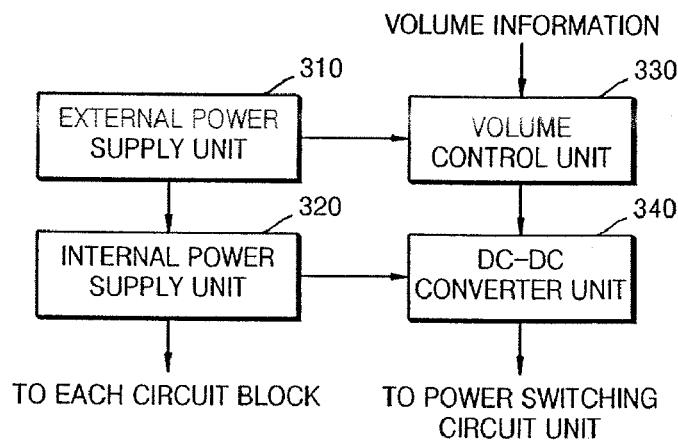
FIG. 3 is a detailed view illustrating an exemplary embodiment of the variable power supply unit illustrated in FIG. 2.

FIG. 3 is a detailed view illustrating an exemplary embodiment of the variable power supply unit 240 illustrated in FIG. 2.

The variable power supply unit 240 illustrated in FIG. 3 includes an external power supply unit 310, an internal power supply unit 320, a volume control unit 330, and a DC-DC converter unit 340.

The external power supply unit 310 supplies external power using a battery charger or a cradle.

The internal power supply unit 320 is an internal battery which may be constructed of a secondary battery which is rechargeable by using the power voltage supplied from the external power supply unit 310. The internal power supply unit 320 separately supplies a voltage to each circuit block and the DC-DC converter unit 340.

The volume control unit 330 detects an installation of the external power supply unit 310 and then generates a voltage control value corresponding to a current volume value if it is detected that the external power supply unit 310 is installed. For example, the volume control unit 330 reads volume information currently generated in the MICOM unit 220 of FIG. 2 if the external power supply unit 310 is installed. If the read volume value is higher than a reference value, the volume control unit 330 generates a volume control value corresponding to the volume value and applies it to the DC-DC converter unit 340. Otherwise, the volume control unit 330 issues a volume control command to the MICOM unit 220 in order to use an existing volume control method.

The DC-DC converter unit 340 converts a voltage supplied from the internal power supply unit 320 into a voltage corresponding to a current volume level according to the voltage control value generated in the volume control unit 330 in a variable manner. The DC-DC converter unit 340 supplies the converted voltage to the power switching circuit unit 250 of FIG. 2. As a result, the power switching circuit unit 250 performs power switching according to the boosted voltage supplied from the DC-DC converter unit 340 instead of the voltage supplied from the internal power supply unit 320.

Figure 4:
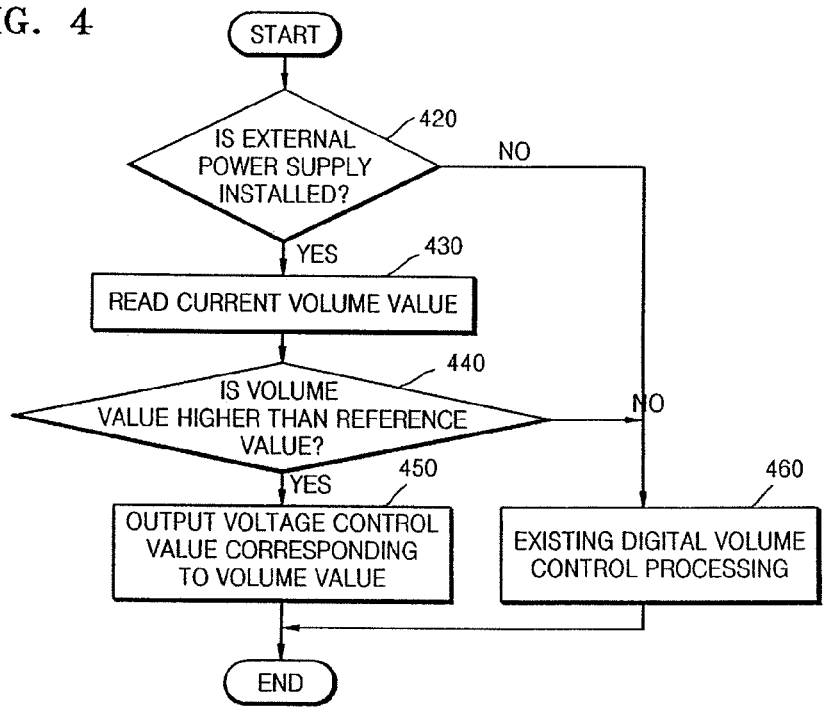
FIG. 4 is a flowchart illustrating operations of the volume control unit illustrated in FIG. 3.

FIG. 4 is a flowchart illustrating operations of the volume control unit 330 illustrated in FIG. 3.

In operation 420, it is detected whether the external power supply unit such as a battery charger or a cradle, is installed by using a predetermined sensor. The predetermined sensor may be a typical on/off switch or an installation sensor. When it is determined that the external power supply is not installed, a command to control the volume using an existing digital volume control is generated.

In contrast, when it is determined that the external power supply is installed, the volume value which is currently set is read from the volume information in operation 430.

In operation 440, the current volume value is compared with the reference value. Accordingly, the reference value is set as a volume value capable of reproducing the audio signal without amplification using the DC-DC converter unit 340 of FIG. 3.

If the current volume value is smaller than the reference value, a command to control the volume using the existing digital volume control is generated in operation 460. Accordingly, the voltage of the power supply unit is set to a minimum value within an allowed range in order to minimize sound quality degradation caused by power noises.

In contrast, if the current volume value is higher than the reference value, the output level cannot be sufficiently driven by only the voltage from the internal power supply unit 320 of FIG. 3 as the volume value increases. Therefore, a voltage control value corresponding to the volume value is supplied to the DC-DC converter unit 340 in operation 450. The DC-DC converter unit 340 outputs the boosted voltage corresponding to the voltage control value to the power switching circuit unit 250 of FIG. 2 to allow the output to be controlled.

Figure 5:
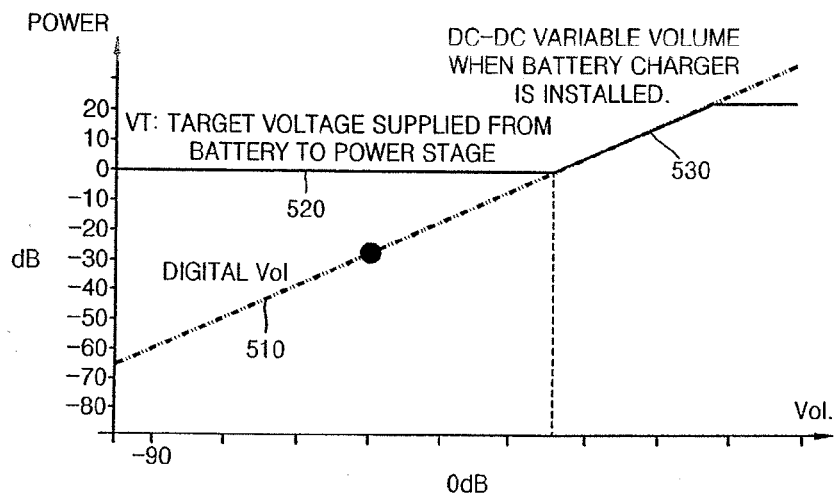
FIG. 5 is a graph illustrating a method of setting a target voltage in a volume control unit according to an embodiment of the present general inventive concept.

FIG. 5 is a graph illustrating a method of setting a target voltage using the volume control unit 330 of FIG. 3, according to an embodiment of the present general inventive concept.

Referring to FIG. 5, the reference numeral 510 denotes a volume curve that uses conventional digital volume control processing, the reference numeral 520 denotes a level of a target voltage $V_T$ supplied from the battery to the power switching circuit, and the reference numeral 530 denotes a volume curve that is changed by the DC-DC converter unit 340 of FIG. 3 when a battery charger is installed.

As illustrated in a line 520 of the graph of FIG. 5, a voltage $V_T$ is supplied to the power switching circuit unit 250 of FIG. 2 from only the internal power supply unit 320 of FIG. 3 when the current cannot be sufficiently applied (for example, when the battery charger is not installed). This voltage level is supposed to be 0 dB. In this case, the volume control is performed by only the conventional digital volume control processing as illustrated in a line 510 of the graph.

In addition, when the current can be sufficiently applied (for example, when the battery charger is installed), the voltage level can be increased by the DC-DC converter unit 340 up until a desired output level of the PWM signal is obtained. This voltage level is expressed as X dB. In this case, the volume level is increased as high as X dB in comparison with the region 510 that can be controlled by only the conventional digital volume. In addition, since the power switching circuit unit 250 is driven by only the voltage boosted by the DC-DC converter unit 340, the output of the PWM signal can be increased as high as the boosted voltage without a change of current or impedance of the loud speaker unit 270 of FIG. 2. Furthermore, if the output of the signal is increased over a predetermined level, a listener becomes relatively more sensitive to the power noise which is output together with the sound signal. Therefore, the power switching circuit unit 250 is driven by a low voltage using an internal battery during a portable state, and is driven by an external high voltage when the battery charger is installed, thereby increasing a maximum output level.

Figure 6:
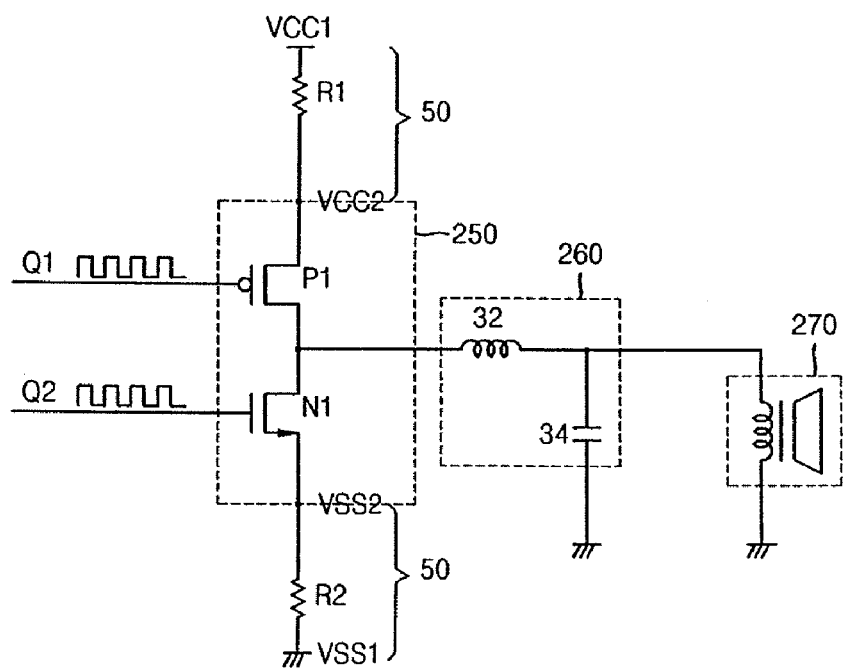
FIG. 6 is a circuit diagram illustrating a switching circuit unit and a low pass filter (LPF) unit according to an embodiment of the present general inventive concept.

FIG. 6 is a circuit diagram illustrating the power switching circuit unit 250 of FIG. 2 and the LPF unit 260 of FIG. 2, according to an embodiment of the present general inventive concept.

The power switching circuit unit 250 can include a PMOS transistor P1 and an NMOS transistor N1. A PWM signal is divided into a first PWM signal Q1 and a second PWM signal Q2 that have the same phase. Power switching of the PMOS transistor P1 is performed depending on the first PWM signal Q1, so that an actual voltage Vcc2 is supplied to its source. The power switching of the NMOS transistor N1 is performed depending on the second PWM signal Q2, so that its drain is connected to a drain of the PMOS transistor P1, and its source is connected to a ground voltage Vss2. In this case, a voltage Vcc1 is supplied from the DC-DC converter unit 340, and the voltages Vcc2 and Vss2 are dropped to a predetermined value by resistors R1 and R2, respectively in a wire line 50, which interconnects between the voltage source and the power switching circuit unit 250, and correspond to an actual voltage supplied to the power switching circuit unit 250.

The LPF unit 260 includes an inductor 32 and a capacitor 34, and removes a high frequency component from the output signal of the power switching circuit unit 250.

Figure 7:
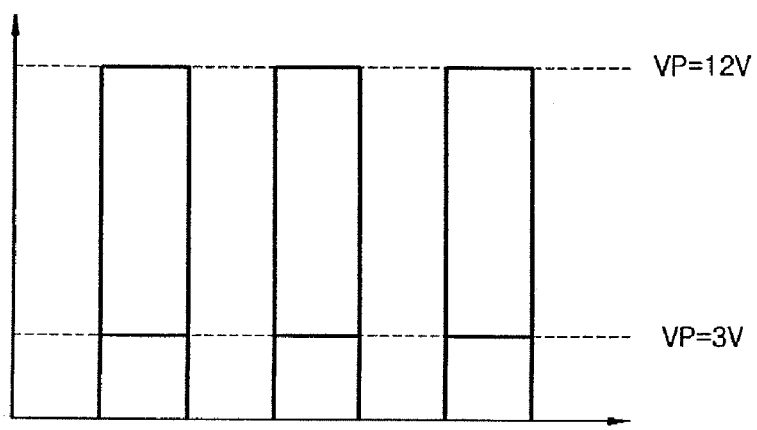
FIG. 7 is a waveform chart of a PWM signal that is output from a switching signal unit according to an embodiment of the present general inventive concept.

FIG. 7 is a waveform chart of a PWM signal output from the power switching circuit unit 250 according to an embodiment of the present general inventive concept.

Referring to FIG. 7, the power switching circuit unit 250 of FIG. 2 increases an output from 1.2 W to 20 W when a supplied voltage $V_P$ increases from 3 V to 12 V.

The general inventive concept can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the present general inventive concept, since a variable DC-DC power supply to drive a switching power amplifier stage is separately provided, it is possible to control a volume using a boosted voltage and to improve an S/N ratio when an external power supply (e.g., a battery charger) is installed. Also, since a loud speaker is driven using a high output voltage, it is possible to provide a user with an optimal system. In addition, since the switching power amplifier stage is driven by a separate power supply other than an external power supply, there is no influence of noises from an external power supply. Furthermore, it is possible to improve the S/N ratio by adaptively controlling a volume using a variable power supply.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A mobile device comprising:
    a microcomputer unit to generate a volume value corresponding to a volume setting;
    a pulse width modulation (PWM) unit to modulate a digital audio signal into a PWM signal that has a small output level;
    a variable power supply unit to detect an installation of an external power supply and to convert a voltage of an internal power supply into a DC-DC voltage in a variable manner on the basis of a voltage control value corresponding to the volume value generated in the microcomputer unit; and
    a power switching circuit unit to perform switching power amplification on a PWM signal generated in the pulse width modulation unit based on a voltage output from the variable power supply unit.

2. The mobile device of claim 1, wherein the variable power supply unit includes:
    an internal power supply unit to supply a power voltage charged with an external power supply;
    a volume control unit to detect installation of the external power supply to generate a voltage control value corresponding to a current volume level; and
    a DC-DC converter unit to convert a voltage of an internal power supply unit into a DC-DC voltage in a variable manner on the basis of the voltage control value generated in the volume control unit.

3. The mobile device of claim 1, wherein the power switching circuit unit includes switching elements to perform switching power amplification on the PWM signal based on a voltage output from the DC-DC converter unit.

4. A method of supplying a power voltage to a mobile device in a variable manner, the method comprising:
    modulating a digital audio signal into a pulse width modulation (PWM) signal;
    detecting an installation of an external power supply;
    reading a volume value when it is detected that the external power supply is connected;
    generating a voltage control value corresponding to the volume value by comparing the volume value with a reference value;
    performing a DC-DC conversion in a variable manner for a voltage supplied from an internal power supply unit on the basis of the generated voltage control value; and
    performing power switching on the PWM signal on the basis of the voltage control value to control a signal output.

5. The method of claim 4, wherein during the generation of the voltage control value, a command is issued to generate a voltage control value corresponding to the volume value when the read volume value is higher than a reference value, and otherwise, to perform a conventional volume control.

6. An apparatus to supply a power voltage to a mobile device in a variable manner, the apparatus comprising:
    a pulse width modulator to modulate a digital audio signal into a pulse width modulation (PWM) signal;
    a sensor to detect whether an external power supply is installed;

a microcomputer to read a volume value when the external power supply is detected;

a volume control unit to generate a voltage control value corresponding to the volume value by comparing the volume value with a reference value;

a DC-DC converter unit to perform a DC-DC conversion in a variable manner for a voltage supplied from an internal power supply unit on the basis of the generated voltage control value; and a power switching unit to perform power switching on the PWM signal on the basis of the generated voltage control value to control a signal output.

* * * * *